(12) United States Patent
Asai et al.

(10) Patent No.: US 10,847,441 B2
(45) Date of Patent: Nov. 24, 2020

(54) COOLING SYSTEM

(71) Applicant: MITSUBISHI ELECTRIC CORPORATION, Chiyoda-ku (JP)

(72) Inventors: Yugo Asai, Chiyoda-ku (JP); Masaru Shinozaki, Chiyoda-ku (JP); Hiroyuki Ushifusa, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/479,379

(22) PCT Filed: Nov. 22, 2017

(86) PCT No.: PCT/JP2017/042079
§ 371 (c)(1),
(2) Date: Jul. 19, 2019

(87) PCT Pub. No.: WO2018/168088
PCT Pub. Date: Sep. 20, 2018

(65) Prior Publication Data
US 2019/0393133 A1 Dec. 26, 2019

(30) Foreign Application Priority Data

Mar. 16, 2017 (JP) ................. 2017-051517

(51) Int. Cl.
*H01L 23/473* (2006.01)
*H05K 7/20* (2006.01)
(Continued)

(52) U.S. Cl.
CPC ............ *H01L 23/473* (2013.01); *B60K 11/02* (2013.01); *B60L 1/003* (2013.01); *F28D 15/02* (2013.01);
(Continued)

(58) Field of Classification Search
CPC ........... H05K 7/20254; H05K 7/20509; H05K 7/20872; H05K 7/20927; H01L 23/473; F28F 2215/04; F28F 3/12
See application file for complete search history.

(56) References Cited

U.S. PATENT DOCUMENTS 4,765,397 A * 8/1988 Chrysler ............... H01L 23/473
165/104.33
5,915,463 A * 6/1999 Romero ................ H01L 23/473
165/80.3
(Continued)

FOREIGN PATENT DOCUMENTS

JP 2014-33095 A 2/2014
JP 2014-60248 A 4/2014
(Continued)

OTHER PUBLICATIONS

International Search Report dated Feb. 6, 2018 in PCT/JP2017/042079 filed on Nov. 22, 2017.

*Primary Examiner* — Robert J Hoffberg
(74) *Attorney, Agent, or Firm* — Xsensus LLP

(57) ABSTRACT

A cooling system includes: a placement plate on which a plurality of components are disposed; and a liquid refrigerant flow path, which is formed on an opposite side of the placement plate with respect to the plurality of components, and is configured to allow a liquid refrigerant for cooling the plurality of components to flow therethrough. The path includes: a first heat-radiating portion disposed at a liquid refrigerant inlet portion around which fins are disposed such that distances from a flow-path inlet portion to the fins are gradually farther away from a flow-path side wall toward a center of the path; a second heat-radiating portion which includes fins having a curved shape; a third heat-radiating portion having no fins; a fourth heat-radiating portion having higher fin-mounting density than the first and the second (Continued)

heat-radiating portions, an inlet and an outlet through which the liquid refrigerant flows in and out.

8 Claims, 11 Drawing Sheets

(51) Int. Cl.
  *F28F 3/12* (2006.01)
  *B60K 11/02* (2006.01)
  *B60L 1/00* (2006.01)
  *F28D 15/02* (2006.01)

(52) U.S. Cl.
  CPC ........... *F28F 3/12* (2013.01); *H05K 7/20254* (2013.01); *H05K 7/20509* (2013.01); *H05K 7/20872* (2013.01); *H05K 7/20927* (2013.01); *B60L 2240/36* (2013.01); *F28F 2215/04* (2013.01)

(56) References Cited

U.S. PATENT DOCUMENTS

| | | | | |
|---|---|---|---|---|
| 6,173,758 B1* | 1/2001 | Ward | ................. | H01L 23/3677 165/80.3 |
| 7,073,573 B2* | 7/2006 | Agee | ..................... | F28D 9/0062 165/146 |
| 7,411,290 B2* | 8/2008 | Lee | ....................... | H01L 23/473 257/712 |
| 7,411,789 B2* | 8/2008 | Nishimura | ................ | F28F 3/04 165/80.3 |
| 8,081,465 B2* | 12/2011 | Nishiura | ............. | H01L 23/3735 165/147 |
| 8,159,823 B2* | 4/2012 | Murakami | ........... | H01L 23/473 180/243 |
| 8,342,276 B2* | 1/2013 | Murakami | ........... | H01L 23/473 180/65.31 |
| 9,414,525 B2* | 8/2016 | Campbell | ............ | H05K 7/2039 |
| 9,439,325 B2* | 9/2016 | Campbell | ............ | H05K 7/2039 |
| 9,653,379 B2* | 5/2017 | Koyama | ........... | H05K 7/20927 |
| 9,673,130 B2* | 6/2017 | Gohara | ................. | H01L 23/473 |
| 9,837,956 B2* | 12/2017 | Siddiqui | ............... | H02S 40/425 |
| 10,617,035 B2* | 4/2020 | Mayberry | ............... | B33Y 80/00 |
| 2006/0021736 A1* | 2/2006 | Tran | ........................ | F28F 3/022 165/80.3 |
| 2009/0145581 A1* | 6/2009 | Hoffman | .................. | F28F 1/40 165/80.3 |

FOREIGN PATENT DOCUMENTS

| | | |
|---|---|---|
| JP | 2015-226039 A | 12/2015 |
| WO | WO 2009/069578 A1 | 6/2009 |
| WO | WO 2010/150747 A1 | 12/2010 |
| WO | WO-2013118869 A1 * | 8/2013 ......... H01L 23/3677 |

* cited by examiner

COOLING SYSTEM

TECHNICAL FIELD

The present invention relates to a cooling system configured to cool, for example, a power conversion apparatus mounted to a vehicle with a liquid refrigerant.

BACKGROUND ART

A power conversion apparatus mounted to a vehicle includes, in order to perform switching or rectification, semiconductor devices such as metal-oxide-semiconductor field effect transistors (MOSFET) and insulated gate bipolar transistors (IGBT), and electronic devices such as reactors and capacitors.

There has been known a liquid-cooled type cooling device in which, in order to cool a power conversion apparatus having those electronic devices mounted thereto, a liquid refrigerant is allowed to flow in a flow path formed by a cooling liquid inlet, a cooling liquid outlet, and an aluminum corrugated fin disposed at a portion between the cooling liquid inlet and the cooling liquid outlet (see, for example, Patent Literature 1).

In the liquid-cooled type cooling device described above, a liquid refrigerant is allowed to flow into the flow path from a longitudinal direction rather than a transverse direction in which a semiconductor element is disposed, to thereby shorten a length of the flow path so that a low pressure loss is achieved. Further, in association with an increase in cross-sectional area of the flow path, in order to attain even flow velocity distribution in a width direction in the flow path, a shape of a cooling liquid outlet is formed so as to be asymmetric to a shape of a cooling liquid inlet shape in an axial direction.

Further, in recent years, along with global fuel regulations, electrically-driven automobiles are being spread, and there are demands for downsizing and reduction in weight of a cooling system for a power conversion apparatus.

CITATION LIST

Patent Literature

[PTL 1] WO 2009/069578 A

SUMMARY OF INVENTION

Technical Problem

In the related-art liquid-cooled type cooling device, the cooling liquid inlet and the cooling liquid outlet are disposed such that the liquid refrigerant is evenly distributed on a plane perpendicular to a flow direction at a portion in which the corrugated fin is mounted. However, there arises a problem in that, when such a cooling liquid inlet and a cooling liquid outlet are provided in the flow path, a volume of the flow path is increased. The cooling liquid inlet and the cooling liquid outlet are each referred to as "header". The header is a non-heated flow path region provided to attain an even flow of the cooling liquid for the purpose of distributing and merging the cooling liquid. Further, the portion at which the fin is mounted is referred to as "cooling region". The cooling region is a heated region in which a heat-generating element and an electronic device are mounted.

The present invention has been made to solve the above-mentioned problem, and has an object to provide a small and light-weight cooling system, which includes no header and reduces a pressure loss while maintaining cooling performance.

Means for Solving the Problems

A cooling system according to the present invention includes: a placement plate on which pin fins are disposed; and a liquid refrigerant flow path, which is formed on an opposite side of the placement plate, and is configured to allow a liquid refrigerant for cooling a plurality of components to flow therethrough. The liquid refrigerant flow path includes: an inlet, which is disposed in a vertical direction with respect to the liquid refrigerant flow path, and allows the liquid refrigerant to flow into the liquid refrigerant flow passage; and an outlet, which is disposed in the vertical direction with respect to the liquid refrigerant flow path, and allows the liquid refrigerant to flow out from the liquid refrigerant flow passage. The liquid refrigerant flow path is divided along a direction of the flow path into a region in which the liquid refrigerant flows from the inlet to the outlet in a shortest distance and a region in which the liquid refrigerant flows in regions other than the above-mentioned region, and has a flow path configuration having different fin-mounting volume ratios in a plurality of regions.

Advantageous Effects of Invention

The cooling system according to the present invention includes: the placement plate on which the pin fins are disposed; and the liquid refrigerant flow path, which is formed on the opposite side of the placement plate, and is configured to allow the liquid refrigerant for cooling the plurality of components to flow therethrough. The liquid refrigerant flow path includes: the inlet, which is disposed in the vertical direction with respect to the liquid refrigerant flow path, and allows the liquid refrigerant to flow into the liquid refrigerant flow passage; and the outlet, which is disposed in the vertical direction with respect to the liquid refrigerant flow path, and allows the liquid refrigerant to flow out from the liquid refrigerant flow passage. The liquid refrigerant flow is divided along the direction of the flow path into the region in which the liquid refrigerant flows from the inlet to the outlet in the shortest distance and the region in which the liquid refrigerant flows in regions other than the above-mentioned region, and has the flow path configuration having different fin-mounting volume ratios and different pressure losses in the plurality of regions. Therefore, even without a header, in a portion on which the pin fins are mounted, in particular, immediately below a surface on which a heat-generating element is mounted, when the liquid refrigerant flow path is divided into the region in which the liquid refrigerant flows from the inlet to the outlet in a shortest distance and a region in which the liquid refrigerant flows in regions other than the above-mentioned region, in a plane perpendicular to the flow direction of the liquid refrigerant, a pressure loss is set to be large at a portion having a large inflow amount of the liquid refrigerant from the inlet, and a pressure loss is set to be small at a portion having a small inflow amount of the liquid refrigerant from the inlet. As a result, the liquid refrigerant is distributed evenly to both regions, and hence a small and light-weight cooling system can be obtained which reduces a pressure loss while maintaining cooling performance.

DESCRIPTION OF EMBODIMENTS

Figure 1:
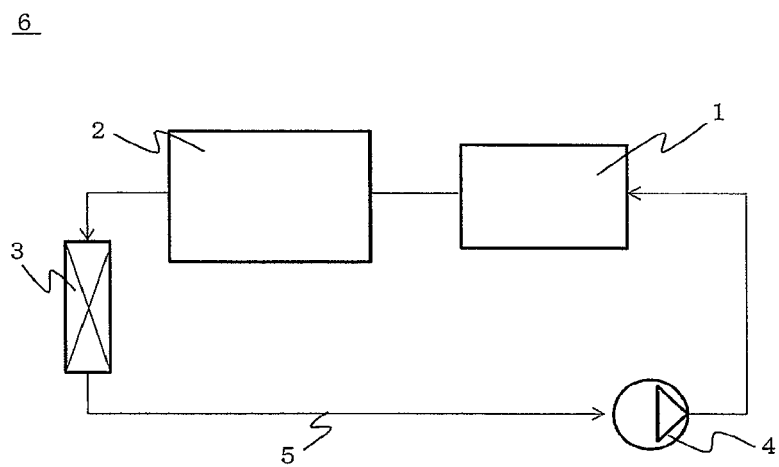
FIG. 1 is a configuration diagram for illustrating a cooling system according to a first embodiment of the present invention.

A description is now given of a cooling system according to a preferred embodiment of the present invention referring to the drawings, and the same or corresponding components are denoted by the same reference symbols throughout the drawings. In each of the embodiments described below, the cooling system configured to cool a power conversion apparatus is exemplified. The embodiments described below are merely examples, and the present invention is not limited to those embodiments.

First Embodiment

Figure 2:
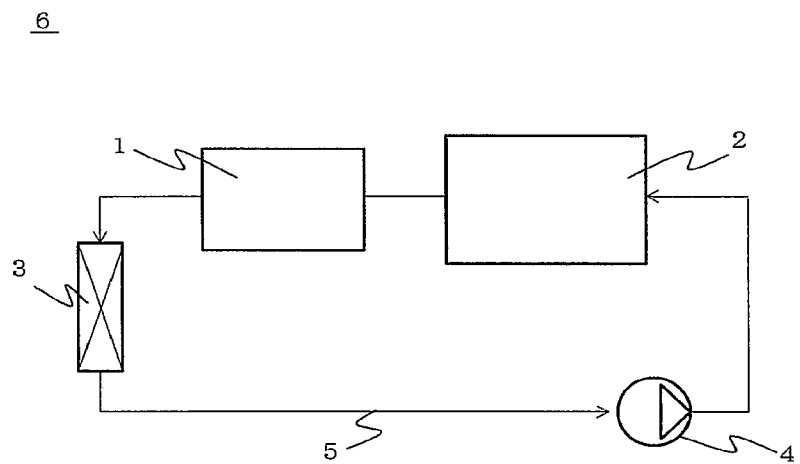
FIG. 2 is a configuration diagram for illustrating the cooling system according to the first embodiment of the present invention.

FIG. 1 and FIG. 2 are configuration diagrams for illustrating a cooling system according to a first embodiment of the present invention. FIG. 1 and FIG. 2 are each an illustration of a cooling system 6 which is configured to cool a power conversion apparatus 1 configured to control a motor 2 as a power generating source or a driving source. The cooling system 6 includes the power conversion apparatus 1, a pump 4, and a radiator 3. The power conversion apparatus 1 is configured to control the motor 2 as a power source or a driving source. The pump 4 is configured to circulate a liquid refrigerant, which draws heat from the power conversion apparatus 1 and the motor 2, in a liquid refrigerant pipe 5. The radiator 3 is configured to cool the liquid refrigerant which has received the heat of the power conversion apparatus 1 and the motor 2.

Here, as an order in which the liquid refrigerant flows, there is a case in which the liquid refrigerant flows via the power conversion apparatus 1 to the motor 2 as illustrated in FIG. 1, and there is another case in which the liquid refrigerant flows via the motor 2 to the power conversion apparatus 1 as illustrated in FIG. 2. Note that, the former configuration can cool the power conversion apparatus 1 with the liquid refrigerant at low temperature before the liquid refrigerant receives the heat of the motor 2, and hence downsizing or improvement in output can be achieved.

The cooling system 6 is, for example, a cooling system 6 configured to cool the power conversion apparatus 1 by circulating the liquid refrigerant as a refrigerant, and is mounted on a vehicle such as an automobile or a train. In this embodiment, an antifreeze liquid (LLC) is used in which an additive serving a role of a rust-preventing agent, a preservative, and a defoaming agent is mixed in an aqueous solution of ethylene glycol as a liquid refrigerant. However, other refrigerants may be used.

Figure 3:
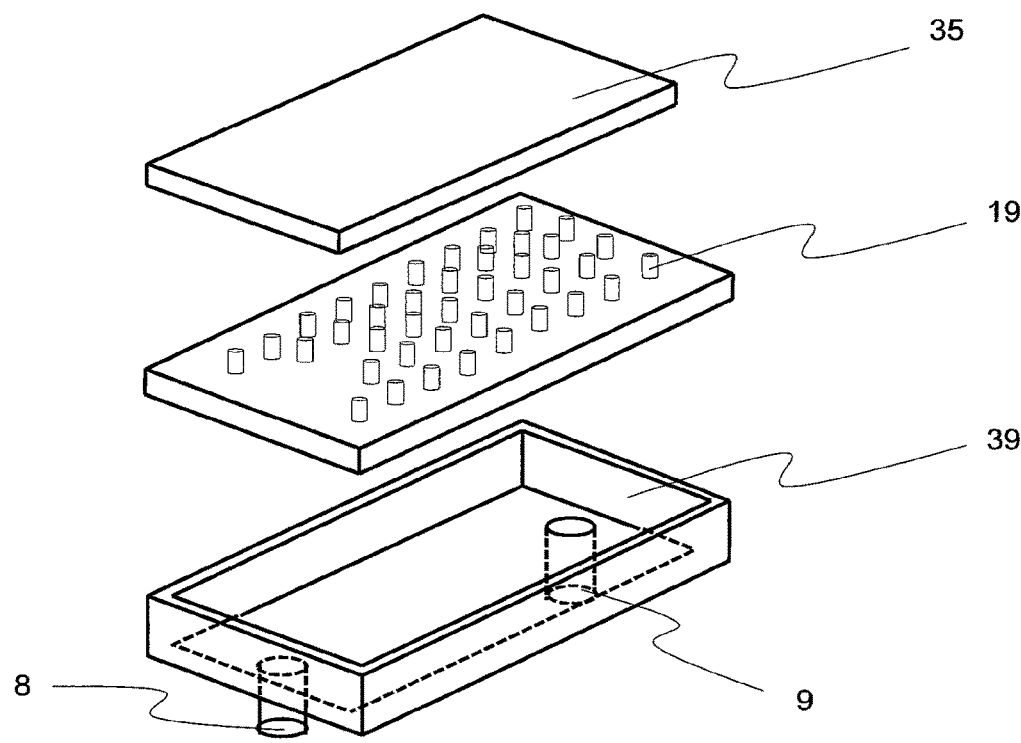
FIG. 3 is a perspective view for illustrating a power conversion apparatus of the cooling system according to the first embodiment of the present invention.

FIG. 3 is a perspective view for illustrating the power conversion apparatus of the cooling system according to the first embodiment of the present invention. Further, FIG. 4 is a top view for illustrating the power conversion apparatus of the cooling system according to the first embodiment of the present invention.

Figure 4:
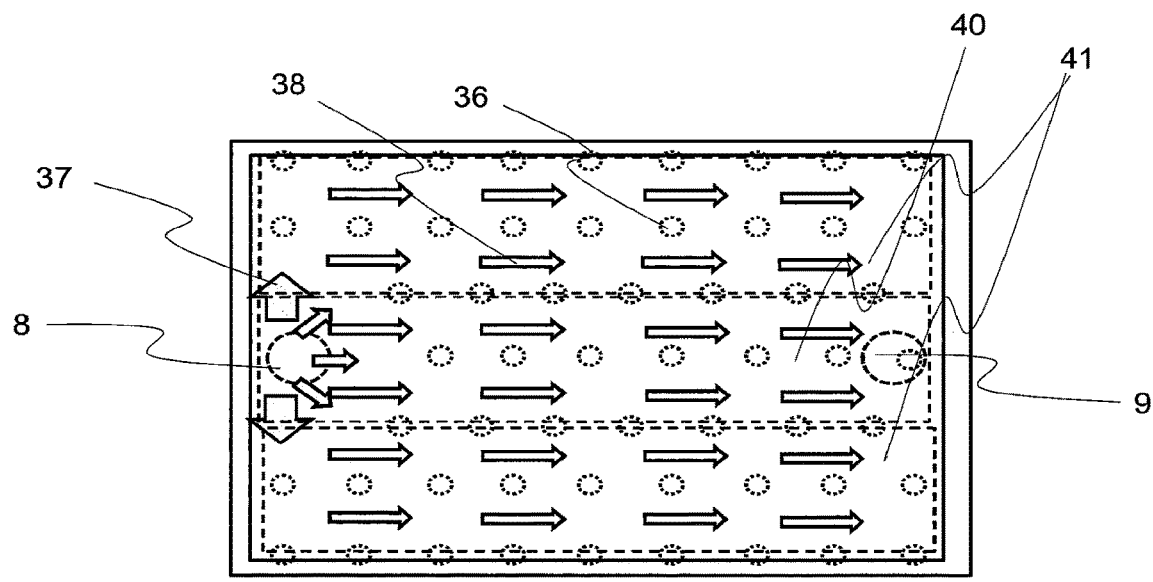
FIG. 4 is a top view for illustrating the power conversion apparatus of the cooling system according to the first embodiment of the present invention.

With reference to FIG. 3 and FIG. 4, the power conversion apparatus 1 includes electronic devices and a cooler. The power conversion apparatus 1 includes, in order to perform switching or rectification, semiconductor devices such as metal-oxide-semiconductor field effect transistors (MOSFET) and insulated gate bipolar transistors (IGBT), and electronic devices such as reactors and capacitors.

Further, the power conversion apparatus 1 configured to control the motor 2 as a power generating source or a driving source includes the cooler configured to allow the liquid refrigerant to flow to cool those electronic devices.

With reference to FIG. 3 and FIG. 4, the power conversion apparatus 1 includes: a placement plate 19 on which fins are mounted; a heat-generating element 35 such as an electronic device which is mounted on the placement plate 19; a cooler housing 39, which is brought into contact with the placement plate 19 on an opposite side of the surface on which the heat-generating element 35 is mounted, and is closed with the placement plate 19; a liquid refrigerant flow path 14, which is configured to allow the liquid refrigerant, which draws heat of the heat-generating element 35, to flow between the placement plate 19 and the cooler housing 39; an inlet 8 which is disposed in a vertical direction with respect to the liquid refrigerant flow path 14, and is configured to allow the liquid refrigerant to flow into the liquid refrigerant flow path 14; and an outlet 9, which is disposed in the vertical direction with respect to the liquid refrigerant flow path 14, and is configured to allow the liquid refrigerant to flow out from the liquid refrigerant flow path 14. The liquid refrigerant flow path 14 does not include a header, and includes only a cooling region.

As illustrated in FIG. 4, the liquid refrigerant flow path is divided along a direction of the flow path into a first region 40 in which the liquid refrigerant flows from the inlet 8 to the outlet 9 in a shortest distance and second regions 41 in which the liquid refrigerant flows in regions other than the first region 40. When the inlet 8 is disposed in the vertical direction with respect to the liquid refrigerant flow path 14, as in a cooling water flow 37 at a placement flow inlet portion, quantity of the liquid refrigerant likely to flow to the second region 41 is increased. However, in the first region 40 and the second regions 41, a fin-mounting volume ratio is set to be larger in the second regions 41 than the first region 40 to cause a pressure loss in the second region 41 to be large. At a portion at which pin fins are mounted, in particular, immediately below a central position with respect to the flow direction on the heat-generating element 35 in which temperature becomes high by, in particular, thermal interference, as in a cooling water flow 38 in heat-radiating fin portions, the liquid refrigerant is evenly distributed to the first region 40 and the second region 41, with the result that a small and light-weight cooling system can be obtained which reduces a pressure loss while maintaining cooling performance. Further, as illustrated in FIG. 4, a region in a vicinity of the liquid refrigerant inlet portion in the first region has a smaller fin-mounting volume ratio than a region in a vicinity of the liquid refrigerant outlet portion in the first region. In FIG. 4, there are a plurality of heat radiating fins or fin portions 36. As shown in FIG. 4, the first region includes a linear path starting from the inlet portion and extending to the outlet portion. Further, as shown in FIG. 4, the first region 40 is between the two second regions 41. Still further, as shown in FIG. 4, the first region 40 and the second regions 41 have substantially the same length.

Figure 5:
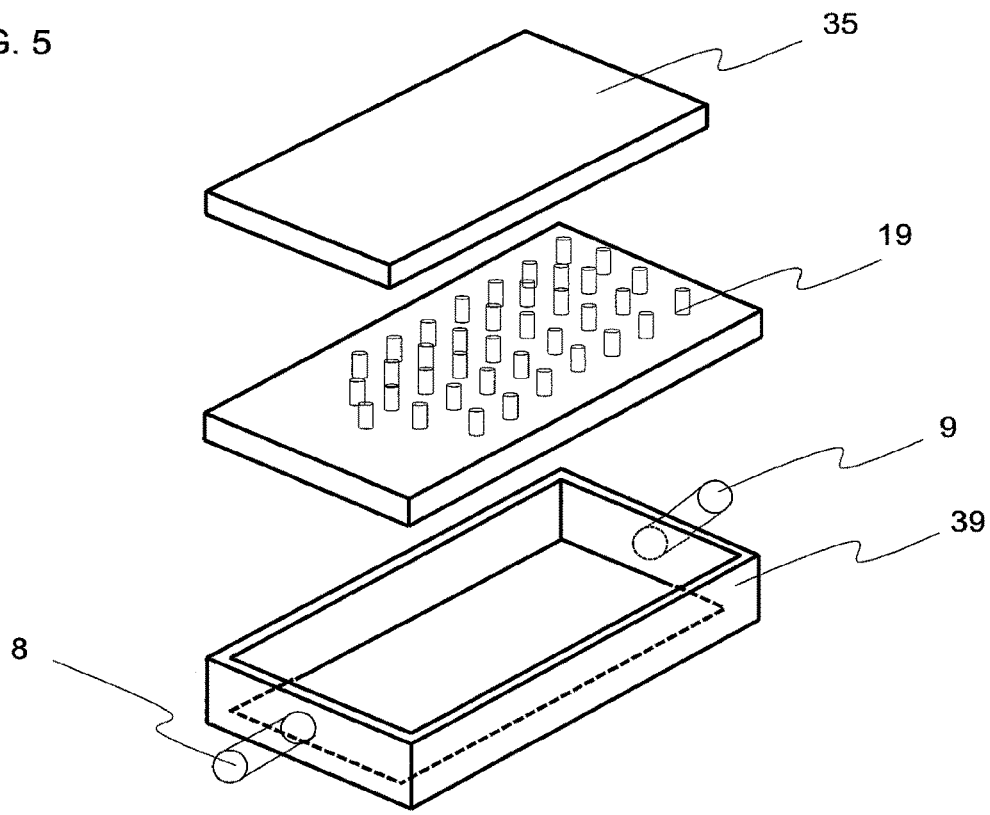
FIG. 5 is a perspective view for illustrating the power conversion apparatus of the cooling system according to the first embodiment of the present invention.

FIG. 5 is a perspective view for illustrating the power conversion apparatus of the cooling system according to the first embodiment of the present invention. Further, FIG. 6 is a top view for illustrating the power conversion apparatus of the cooling system according to the first embodiment of the present invention.

Figure 6:
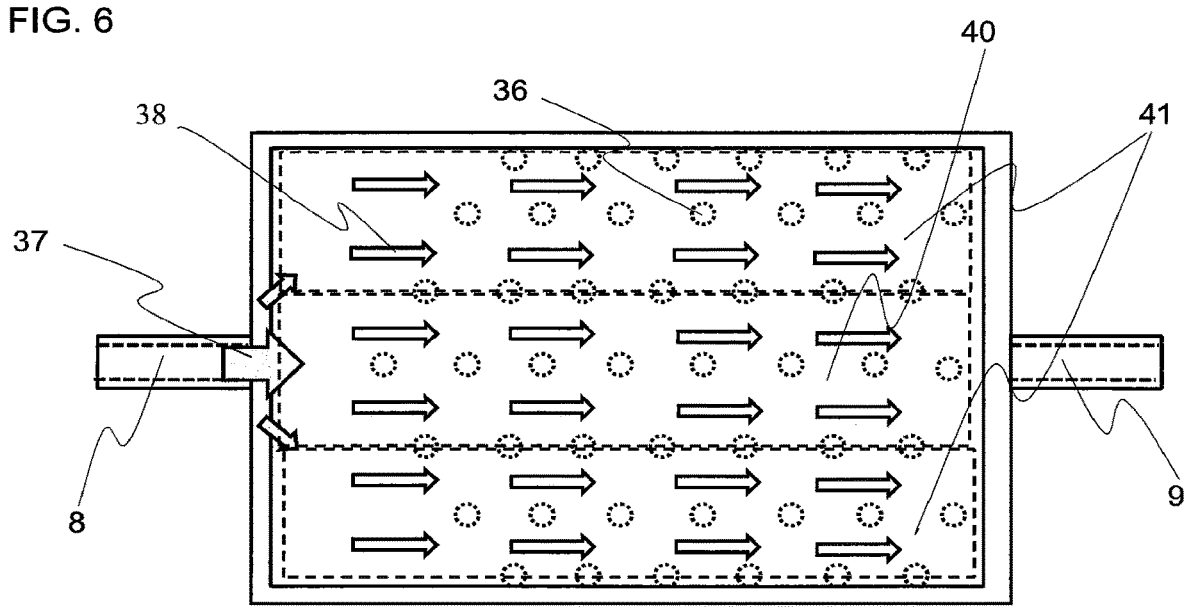
FIG. 6 is a top view for illustrating the power conversion apparatus of the cooling system according to the first embodiment of the present invention.

With reference to FIG. 5 and FIG. 6, the power conversion apparatus 1 includes electronic devices and a cooler. The power conversion apparatus 1 includes, in order to perform switching or rectification, semiconductor devices such as metal-oxide-semiconductor field effect transistors (MOSFET) and insulated gate bipolar transistors (IGBT), and electronic devices such as reactors and capacitors.

Further, the power conversion apparatus 1 configured to control the motor 2 as a power generating source or a driving source includes the cooler configured to allow the liquid refrigerant to flow to cool those electronic devices.

With reference to FIG. 5 and FIG. 6, the power conversion apparatus 1 includes: a placement plate 19 on which fins are mounted; a heat-generating element 35 such as an electronic device which is mounted on the placement plate 19; a cooler housing 39, which is brought into contact with the placement plate 19 on an opposite side of the surface on which the heat-generating element 35 is mounted, and is closed with the placement plate 19; a liquid refrigerant flow path 14, which is configured to allow the liquid refrigerant, which draws heat of the heat-generating element 35, to flow between the placement plate 19 and the cooler housing 39; an inlet 8 which is disposed in in a horizontal direction with respect to the liquid refrigerant flow path 14, and is configured to allow the liquid refrigerant to flow into the liquid refrigerant flow path 14; and an outlet 9, which is disposed in the horizontal direction with respect to the liquid refrigerant flow path 14, and is configured to allow the liquid refrigerant to flow out from the liquid refrigerant flow path 14. The liquid refrigerant flow path 14 does not include a header, and includes only a cooling region.

As illustrated in FIG. 6, the liquid refrigerant flow path is divided along a direction of the flow path into a first 40 in which the liquid refrigerant flows from the inlet 8 to the outlet 9 in a shortest distance and second regions 41 in which the liquid refrigerant flows in regions other than the first region 40. When the inlet 8 is disposed in the horizontal direction with respect to the liquid refrigerant flow path 14, as in a cooling water flow 37 at a placement flow inlet portion, quantity of the liquid refrigerant likely to flow to the first region 40 is increased. However, in the second regions 41 and the first region 40, a fin-mounting volume ratio is set to be larger in the first region 40 than the second regions 41 to cause a pressure loss in the first region 40 to be large. At a portion at which pin fins are mounted, in particular, immediately below a central position with respect to the flow direction on the heat-generating element 35 in which temperature becomes high by, in particular, thermal interference, as in a cooling water flow 38 in heat-radiating fin portions, the liquid refrigerant is evenly distributed to the second regions 41 and the first region 40, with the result that a small and light-weight cooling system can be obtained which reduces a pressure loss while maintaining cooling performance.

Figure 7:
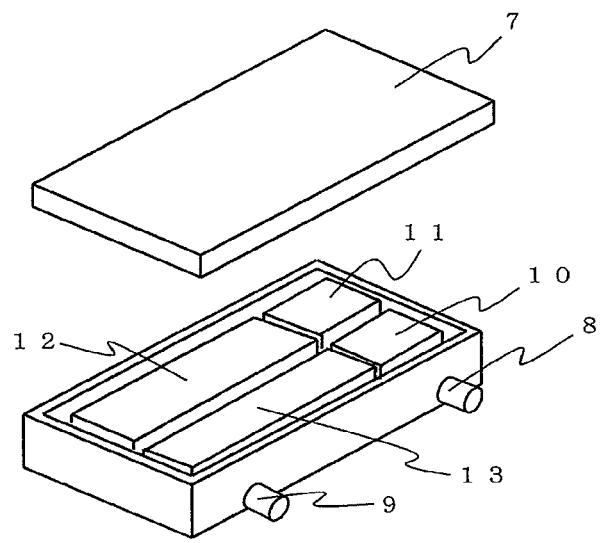
FIG. 7 is a perspective view for illustrating the power conversion apparatus of the cooling system according to the first embodiment of the present invention.
Figure 8:
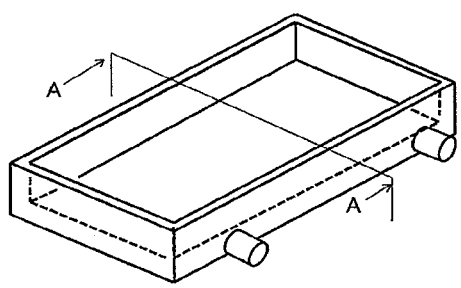
FIG. 8 is a perspective view for illustrating the power conversion apparatus of the cooling system according to the first embodiment of the present invention.

FIG. 7 and FIG. 8 are perspective views for illustrating the power conversion apparatus of the cooling system according to the first embodiment of the present invention. Further, FIG. 9 is a sectional view for illustrating the power conversion apparatus of the cooling system according to the first embodiment of the present invention, and is an illustration of a cross-section taken along the line A-A illustrated in FIG. 8.

Figure 9:
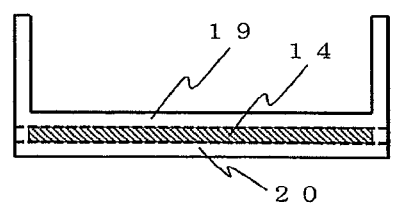
FIG. 9 is a sectional view for illustrating the power conversion apparatus of the cooling system according to the first embodiment of the present invention.

With reference to FIG. 7 to FIG. 9, the power conversion apparatus 1 includes electronic devices and a cooler. The power conversion apparatus 1 includes, in order to perform switching or rectification, semiconductor devices such as metal-oxide-semiconductor field effect transistors (MOSFET) and insulated gate bipolar transistors (IGBT), and electronic devices such as reactors and capacitors.

Further, the power conversion apparatus 1 configured to control the motor 2 as a power generating source or a driving source includes the cooler configured to allow the liquid refrigerant to flow to cool those electronic devices.

With reference to FIG. 7 to FIG. 9, the power conversion apparatus 1 includes: an upper lid 7 configured to cover an upper portion to prevent entry of dust and the like; a first component group 10 such as a reactor configured to boost voltage; a second component group 11 such as a filter configured to remove noise; a third component group 12 configured to convert the voltage; a fourth component group 13 such as a module to be supplied with a direct current which is output from a capacitor, and configured to supply a three-phase alternating current to the motor; the placement plate 19 having an upper surface on which the first to fourth component groups 10 to 13 are mounted, and which is joined to the upper lid 7; a bottom plate 20 which is joined to a lower surface of the placement plate 19; the liquid refrigerant flow path 14 configured to allow the liquid refrigerant, which flows between the placement plate 19 and the bottom plate 20 and draws heat of the first to fourth component groups 10 to 13, to flow therethrough; the inlet 8 configured to allow the liquid refrigerant to flow into the liquid refrigerant flow path 14, and the outlet 9 configured to allow the liquid refrigerant to flow out from the liquid refrigerant flow path 14.

As illustrated in FIG. 7, positions of the first to fourth component groups 10 to 13 are determined due to electrical connection constraint. The third component group 12 has a small amount of heat generation. The fourth component group 13 has a large amount of heat generation. The first component group 10 and the second component group 11 have an intermediate amount of heat generation between the amounts of heat generation of the third component group 12 and the fourth component group 13.

Here, in order to improve cooling efficiency of the first component group 10 and the third component group 12 having relatively low heat-resistant temperature, the inlet 8 of the liquid refrigerant is disposed on the first component group 10 side to prevent the liquid refrigerant from receiving heat from the fourth component group 13 having a large amount of heat generation, and to prevent the first component group 10 and the third component group 12 from being cooled by the liquid refrigerant having been increased in temperature.

Further, as illustrated in FIG. 9, the liquid refrigerant flow path 14 is defined by the placement plate 19 and the bottom plate 20 which are flat plates so that the liquid refrigerant flow path 14 has a constant height in the flow path, with the result that a shape loss by expansion and contraction due to changes in flow path height can be reduced.

Figure 10:
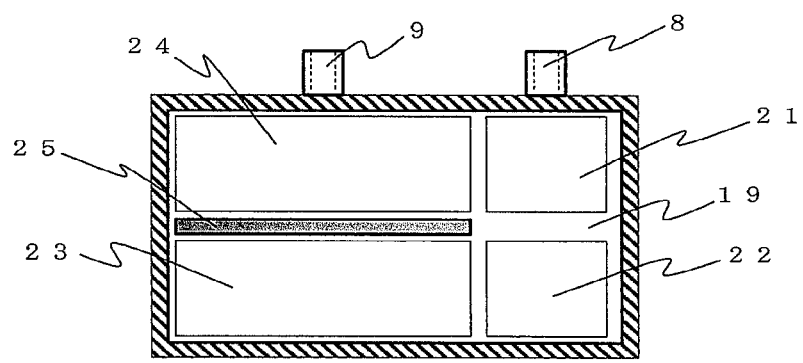
FIG. 10 is a top view for illustrating the power conversion apparatus of the cooling system according to the first embodiment of the present invention.

FIG. 10 is a top view for illustrating the power conversion apparatus of the cooling system according to the first embodiment of the present invention. With reference to FIG. 10, the power conversion apparatus 1 includes: a first region 21 which is a region in which the first component group 10 is mounted; a second region 22 which is a region in which the second component group 11 is mounted; a third region 23 which is a region in which the third component group 12 is mounted, a fourth region 24 which is a region in which the fourth component group 13 is mounted; a terminal block 25 which is configured to fix a bus bar configured to electrically join the third component group 12 and the fourth component group 13, the inlet 8 and the outlet 9.

As illustrated in FIG. 10, positions of the first to fourth regions 21 to 24 are determined due to electrical connection constraint. The third region 23 has a small amount of heat generation. The fourth region 24 has a large amount of heat generation. The first region 21 and the second region 22 have an intermediate amount of heat generation between the amounts of heat generation of the third region 23 and the fourth region 24.

Here, in order to improve cooling efficiency of the first region 21 and the third region 23 having relatively low heat-resistant temperature, the inlet 8 of the liquid refrigerant is disposed on the first component group 10 side to prevent the liquid refrigerant from receiving heat from the fourth region 24 having a large amount of heat generation, and to prevent the first region 21 and the third region 23 from being cooled by the liquid refrigerant having been increased in temperature.

Figure 11:
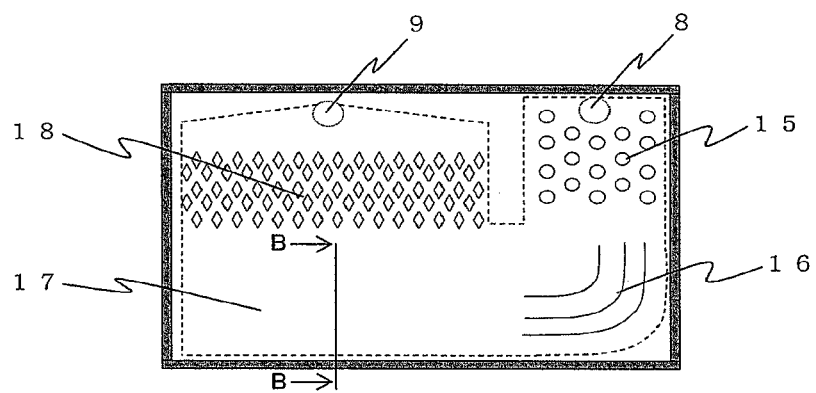
FIG. 11 is an explanatory view for illustrating a liquid refrigerant flow path in the power conversion apparatus of the cooling system according to the first embodiment of the present invention.

FIG. 11 is an explanatory view for illustrating the liquid refrigerant flow path in the power conversion apparatus of the cooling system according to the first embodiment of the present invention. With reference to FIG. 7, the power conversion apparatus 1 includes: a first heat-radiating portion 15 on the first region 21 which is a region in which the first component group 10 is mounted; a second heat-radiating portion 16 on the second region 22 which is a region in which the second component group 11 is mounted; a third heat-radiating portion 17 on the third region 23 which is a region in which the third component group 12 is mounted; and a fourth heat-radiating portion 18 on the fourth region 24 which is a region in which the fourth component group 13 is mounted.

As illustrated in FIG. 10 and FIG. 11, the liquid refrigerant flow path 14 includes: the first heat-radiating portion 15 disposed at a liquid refrigerant inlet portion around which the fins are disposed such that distances from a flow-path inlet portion to the fins are gradually farther away from a flow-path side wall toward a center of the flow path; the second heat-radiating portion which includes fins having a curved shape; the third heat-radiating portion 17; and the fourth heat-radiating portion 18 having higher fin-mounting density than the first heat-radiating portion 15 and the second heat-radiating portion 16. Note that, the first to fourth heat-radiating portions 15 to 18 correspond to the first to fourth regions 21 to 24.

Further, in the power conversion apparatus 1, the terminal block 25, which is configured to fix the bus bar configured to connect the third component group 12 and the fourth component group 13 to each other, is disposed between the third component group 12 and the fourth component group 13. Still further, fixing screw holes to the placement plate 19 are formed up to the liquid refrigerant flow path 14.

Here, the first heat-radiating portion 15 is displaced on a side, which is in contact with the liquid refrigerant flow path 14, of the placement plate 19 on which the first component group 10 is mounted, and a fin shape may be a rounded pin fin shape, a square rod shape, other polygonal pin fin shapes, and the like, to enhance a cooling effect through an increase in heat-radiating area.

Further, the second heat-radiating portion 16 is displaced on the side, which is in contact with the liquid refrigerant flow path 14, of the placement plate 19 on which the second component group 11 is mounted, and the fins are curved so that cooling effect is enhanced and the flow in the flow path is caused to be even, and hence a pressure loss reducing effect is enhanced.

Still further, the third heat-radiating portion 17 is displaced on the side, which is in contact with the liquid refrigerant flow path 14, of the placement plate 19 on which the third component group 12 is mounted, but fins are not mounted, and, in a bottom surface of the flow path, a height of a flow path from one flow path to another flow path is inclined in a cross-section of the flow path.

Thus, when the liquid refrigerant flows from the second heat-radiating portion 16, a ratio of flow amounts of the liquid refrigerant between an inside and an outside with respect to the flow direction is changed. Accordingly, the liquid refrigerant can be supplied over an entire flow path on the side, which is in contact with the liquid refrigerant flow path 14, of the placement plate 19 on which the third component group 12 is mounted, and hence a pressure loss reducing effect is enhanced. Further, the surface serves as an inflow region when the liquid refrigerant is supplied to the fourth component group 13, and reduction in volume can be achieved.

Figure 12:
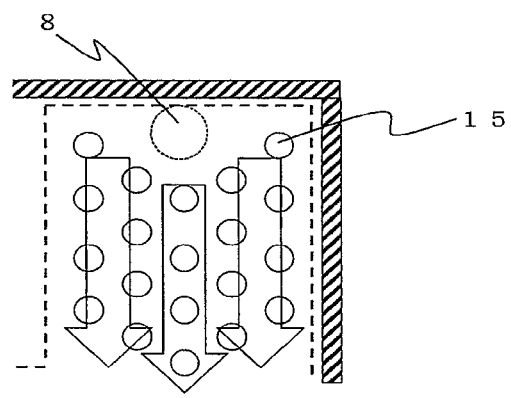
FIG. 12 is a top view for illustrating a first heat-radiating portion in the power conversion apparatus of the cooling system according to the first embodiment of the present invention.

Hereinafter, with reference to FIG. 12 to FIG. 15, features of respective heat-radiating portions are described. FIG. 12 is a top view for illustrating the first heat-radiating portion in the power conversion apparatus of the cooling system according to the first embodiment of the present invention. With reference to FIG. 12, fin shape of the first heat-radiating portion 15 may be a rounded pin fin shape, a square rod shape, other polygonal pin fin shapes, and the like, to enhance a cooling effect through an increase in heat-radiating area.

Figure 13:
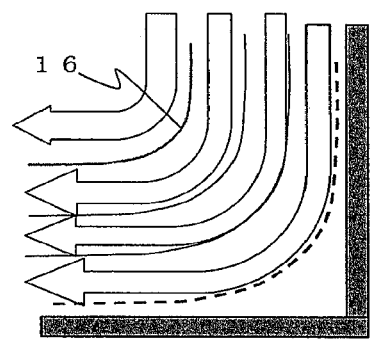
FIG. 13 is a top view for illustrating a second heat-radiating portion in the power conversion apparatus of the cooling system according to the first embodiment of the present invention.

FIG. 13 is a top view for illustrating the second heat-radiating portion in the power conversion apparatus of the cooling system according to the first embodiment of the present invention. With reference to FIG. 13, the fins of the second heat-radiating portion 16 are curved so that the cooling effect is enhanced and the flow in the flow path is caused to be even, and hence a pressure loss reducing effect is enhanced.

Figure 14:
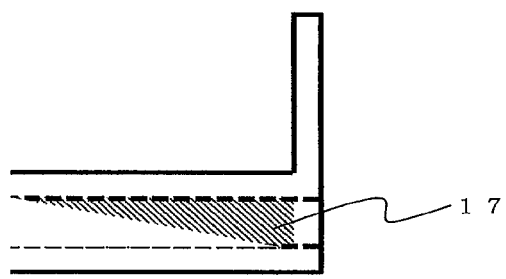
FIG. 14 is a sectional view for illustrating a third heat-radiating portion in the power conversion apparatus of the cooling system according to the first embodiment of the present invention.

FIG. 14 is a sectional view for illustrating the third heat-radiating portion in the power conversion apparatus of the cooling system according to the first embodiment of the present invention, and is an illustration of a cross-section taken along the line B-B illustrated in FIG. 11. With reference to FIG. 14, fins are not mounted on the third heat-radiating portion 17, and, in the bottom surface of the flow path, the height of the flow path from one flow path to another flow path is inclined in the cross-section of the flow path.

Thus, when the liquid refrigerant flows from the second heat-radiating portion 16, the ratio of flow amounts of the liquid refrigerant between the inside and the outside with respect to the flow direction is changed. Accordingly, the liquid refrigerant can be supplied over the entire flow path on the side, which is in contact with the liquid refrigerant flow path 14, of the placement plate 19 on which the third component group 12 is mounted, and hence a pressure loss reducing effect is enhanced. Further, the surface serves as the inflow region when the liquid refrigerant is supplied to the fourth component group 13, and reduction in volume can be achieved.

Figure 15A:
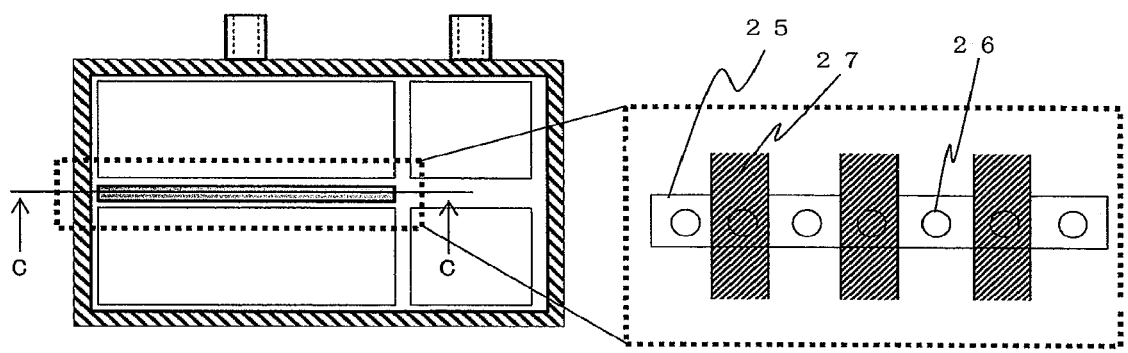
FIG. 15A is a top view for illustrating a terminal block in the power conversion apparatus of the cooling system according to the first embodiment of the present invention.
Figure 15B:
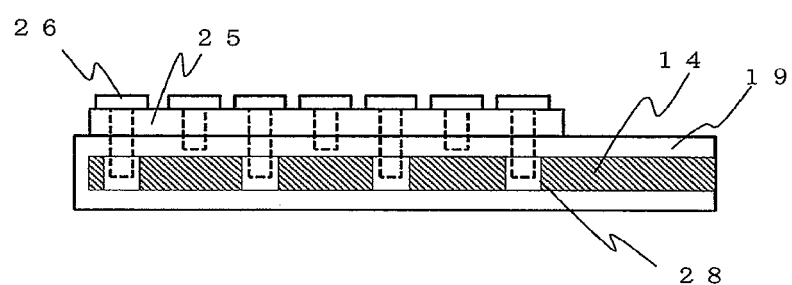
FIG. 15B is a sectional view for illustrating the terminal block in the power conversion apparatus of the cooling system according to the first embodiment of the present invention.

FIG. 15A is a top view for illustrating the terminal block in the power conversion apparatus of the cooling system according to the first embodiment of the present invention, and FIG. 15B is a sectional view for illustrating the terminal block in the power conversion apparatus of the cooling system according to the first embodiment of the present invention. Note that, the sectional view of FIG. 15B is a cross-section taken along the line C-C illustrated in FIG. 15A.

With reference to FIG. 15A and FIG. 15B, in the terminal block 25, which is disposed between the third component group 12 and the fourth component group 13 and is configured to fix a bus bar 27 configured to connect therebetween, and the placement plate 19, bosses 28 having screw holes, which penetrate up to the liquid refrigerant flow path 14, are formed. When the flow of the liquid refrigerant flowing into the fourth component group 13 has velocity distribution, deviation of the velocity distribution is suppressed by the bosses 28 serving as pressure loss bodies, and the flow is rectified. As a result, the deviation of the velocity distribution is suppressed, and the even flow can be attained.

According to such a configuration, in particular, the inlet 8 and the outlet 9 are mounted in the same direction, and when the flow path has a flow path shape including a number of bent portions therein, deviation of velocity distribution occurred in the flow path in the related-art. In contrast, the configuration in which a pressure loss becomes large at the region at which velocity is fast, and a pressure loss becomes small at the region at which velocity is slow. Accordingly, the velocity distribution of the flow path is suppressed, the even flow can be attained, and hence a low pressure loss due the evenness of the flow can be achieved so that a load on the pump 4 is reduced and the pump 4 can be downsized. As a result, the entire cooling system 6 can be downsized, and a pump output can be reduced, and energy saving can be achieved.

Further, when the first component group 10, the second component group 11, the third component group 12, and the fourth component group 13, which are disposed on the placement plate 19, are cooled, the even flow can be attained in the flow path so that the heat can be drawn evenly from the cooling surface. Therefore, unevenness in temperature can be reduced, and hot spots can be eliminated, and hence deterioration caused by heat cycle can be reduced.

Further, to improve heat radiation, the first component group 10, the second component group 11, the third component group 12, and the fourth component group 13 are assembled to the wall surface of the placement plate 19 through a grease, a sheet or the like, and are fixed with fastening members such as screws, by brazing or by joining such as welding.

Still further, without through the grease or the heat-radiating sheet, a case of the first component group 10, a case of the second component group 11, a case of the third component group 12, and a case of the fourth component group 13 may be used in place of the placement plate 19 for a lid of the liquid refrigerant flow path 14. Thus, the grease or the heat-radiating sheet is not used so that heat resistance is reduced, and heat radiation performance can be improved.

Yet further, the first component group 10 of the electric power conversion apparatus 1 is a reactor or the like to boost voltage, the second component group 11 is a filter or the like configured to remove noise, the third component group 12 is a capacitor or the like configured to convert the voltage, and the fourth component group 13 is a module or the like to which a direct current output from the capacitor is supplied and which supplies a three-phase alternating current to the motor.

Note that, as the first component group 10, the second component group 11, the third component group 12, and the fourth component group 13 which generate heat, to perform switching or rectification, semiconductor devices such as metal-oxide-semiconductor field effect transistors (MOSFET), insulated gate bipolar transistors (IGBT), reactors, capacitors or the like may be used as described above, but the present invention is not limited thereto. Further, the first to fourth component groups 10 to 13 are connected to each other by a harness or the like.

As described above, according to the first embodiment, the cooling system includes: the placement plate on which the plurality of components are disposed; and the liquid refrigerant flow path, which is formed on the opposite side of the placement plate with respect to the plurality of components, and is configured to allow the liquid refrigerant for cooling the plurality of components to flow therethrough. The liquid refrigerant flow path includes: the first heat-radiating portion, which is disposed at the liquid refrigerant inlet portion around which the fins are disposed such that distances from the flow-path inlet portion to the fins are gradually farther away from the flow-path side wall toward the center of the flow path; the second heat-radiating portion which includes the fins having a curved shape; the third heat-radiating portion having no fins; and the fourth heat-radiating portion having higher fin-mounting density than the first heat-radiating portion and the second heat-radiating portion, and the inlet and the outlet which are configured to allow the liquid refrigerant to flow in and flow out. In the terminal block which is configured to fix the bus bar configured to connect the third component group which is the component corresponding to the third heat-radiating portion and the fourth component group which is the component corresponding to the fourth heat-radiating portion to each other, and the placement plate 19, the bosses having the screw holes, which penetrate up to the liquid refrigerant flow path, are formed. Therefore, the small and light-weight cooling system can be obtained which reduces a pressure loss while maintaining cooling performance.

Second Embodiment

In the first embodiment, sizes of the bosses 28 are not mentioned. However, in a second embodiment of the present invention, consideration is made on a case in which a size of a boss 32 at a front side is increased and in which a size of a boss 33 at a rear side is reduced with respect to the flow direction of the liquid refrigerant.

Figure 16A:
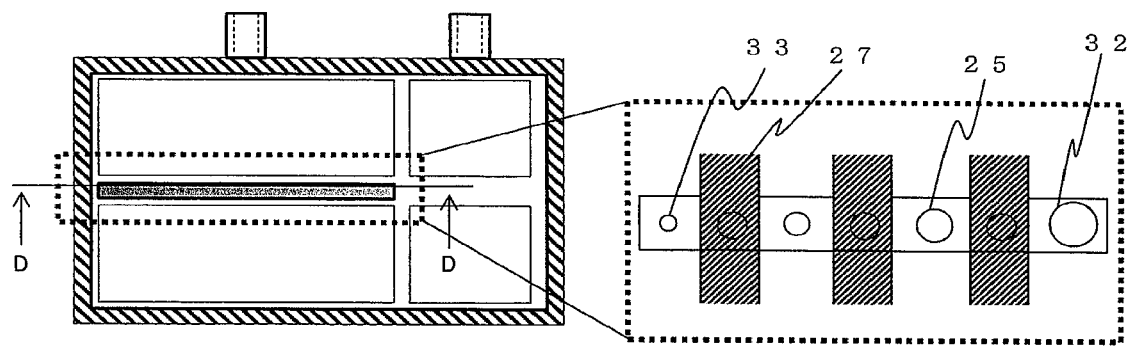
FIG. 16A is a top view for illustrating a terminal block in a power conversion apparatus of a cooling system according to a second embodiment of the present invention.
Figure 16B:
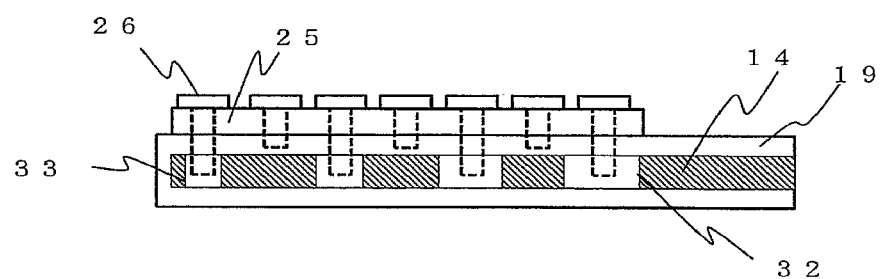
FIG. 16B is a sectional view for illustrating the terminal block in the power conversion apparatus of the cooling system according to the second embodiment of the present invention.

FIG. 16A is a top view for illustrating the terminal block in the power conversion apparatus of the cooling system according to the second embodiment of the present invention. FIG. 16B is a sectional view for illustrating the terminal block in the power conversion apparatus of the cooling system according to the second embodiment of the present invention. Note that, the sectional view of FIG. 16B is a cross-section taken along the line D-D illustrated in FIG. 16A.

With reference to FIG. 16A and FIG. 16B, the size of the boss 32 at the front side is increased and the size of the boss 33 at the rear side is reduced with respect to the flow direction of the liquid refrigerant. According to such a configuration, with respect to the flow direction of the liquid refrigerant, deviation flow, which is caused by the liquid refrigerant easily flown at the boss 32 close to the outlet 9, is suppressed, and the liquid refrigerant is caused to flow easily to the boss 33 at the rear side, and hence deviation of the velocity distribution is suppressed, and effect of evenness of the flow can be further enhanced. In FIG. 16B, there are a plurality of screws 26.

Third Embodiment

In the first embodiment, the fin-mounting density of the fourth heat-radiating portion 18 is not mentioned. However, in the third embodiment of the present invention, consideration is made on changing the fin-mounting density of the fourth heat-radiating portion 18.

Figure 17:
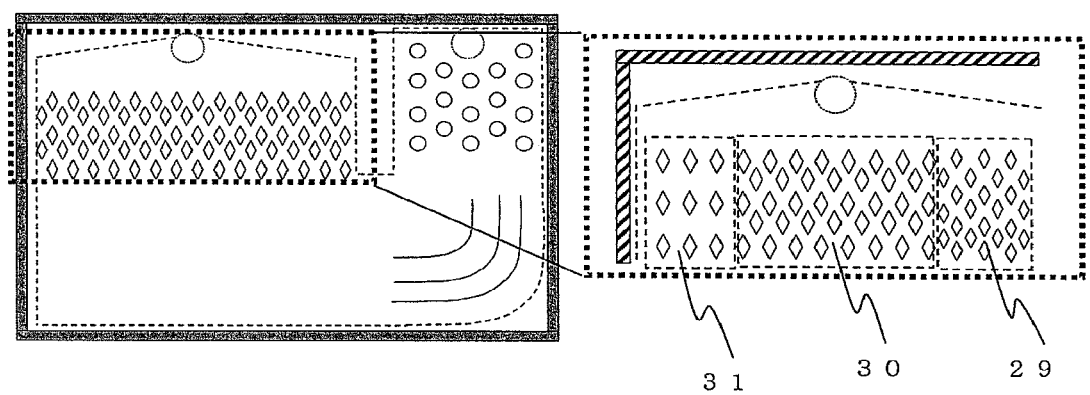
FIG. 17 is a top view for illustrating a fourth heat-radiating portion in a power conversion apparatus of a cooling system according to a third embodiment of the present invention.

FIG. 17 is a top view for illustrating the fourth heat-radiating portion in the power conversion apparatus of the cooling system according to the third embodiment of the present invention. With reference to FIG. 17, heat-generating elements having different heat radiation amounts are mounted to the fourth component group 13. Accordingly, the fourth heat-radiating portion 18 includes fourth heat-radiating fins 31 having coarse fin-mounting density in a heat-radiation region having a small amount of heat generation, fourth heat-radiating fins 29 having dense fin-mounting density in a heat-radiation region having a large amount of heat generation, and fourth heat-radiating fins 30 having fin-mounting density between the fourth heat-radiating fins 31 and the fourth heat-radiating fins 29 in a heat-radiation region having an intermediate amount of heat generation.

According to such a configuration, radiating fins in a cooler usually have the same fin shape, fin pitch, and fin width, but through changing the fin shape, fin pitch, and fin width corresponding to the amount of heat generation, a pressure loss can be reduced while cooling performance is maintained.

Further, through widening the fin pitch of the heat-radiating fin portion in a region in which a component group having a relatively small amount of heat generation, low cost due to not only reduction in pressure loss but also reduction in the number of processing, or weight reduction in the cooler itself can be achieved.

It is generally known that, when a fin shape may be a rounded pin fin shape, a square rod shape, other polygonal pin fin shapes, and the like, cooling efficiency is improved. However, based on an amount of heat generation, other fin shapes such as a straight fin shape, a corrugated fin shape, an offset fin shape, and a wave fin shape may be used.

For example, when a straight fins are used, a fin pitch and a fin width are set based on an amount of heat generation so that a pressure loss can be reduced while cooling performance is maintained in the same manner. Further, aluminum is generally used as the material of the fin, but when copper having high thermal conductivity is used, cooling efficiency can further be improved.

Fourth Embodiment

In the first embodiment, though the material of the fins on the fourth heat-radiating portion 18 is not mentioned, heat-generating elements having different amounts of heat generation are mounted on the fourth component group 13. Accordingly, in the fourth embodiment of the present invention, with reference to FIG. 17, the material of the fourth heat-radiating fins 29 mounted on the heat-radiation region having a large amount of heat generation is changed from aluminum to copper.

According to such a configuration, without fin-mounting density being increased, the material is changed from aluminum to copper having high thermal conductivity so that fin efficiency is improved and a fin effective surface area can be increased. Further, the fin effective surface area can be increased so that the fin-mounting density can conversely be reduced, with the result that a pressure loss can be reduced while cooling performance is maintained.

Fifth Embodiment

In the first to fourth embodiments described above, a mechanism configured to suppress air accumulation is not disposed. However, in the fifth embodiment of the present invention, consideration is made on a case in which a degassing flow path 34 is formed between the first heat-radiating portion 15 and the fourth heat-radiating portion 18.

Figure 18:
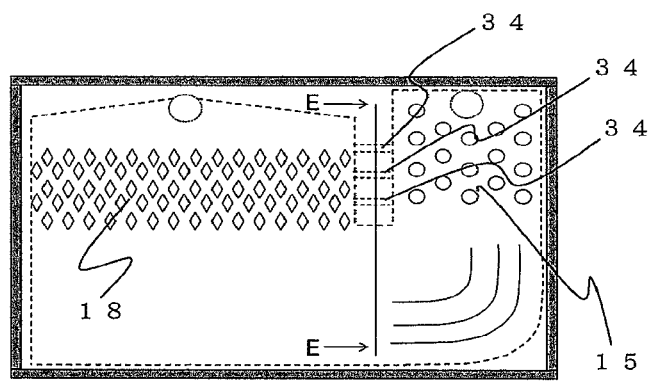
FIG. 18 is an explanatory view for illustrating a liquid refrigerant flow path in a power conversion apparatus of a cooling system according to a fifth embodiment of the present invention.

FIG. 18 is an explanatory view for illustrating a liquid refrigerant flow path in a power conversion apparatus of a cooling system according to the fifth embodiment of the present invention. Further, FIG. 19 is a sectional view for illustrating the liquid refrigerant flow path in the power conversion apparatus of the cooling system according to the fifth embodiment of the present invention, to illustrate a cross-section taken along the line E-E illustrated in FIG. 18.

Figure 19:
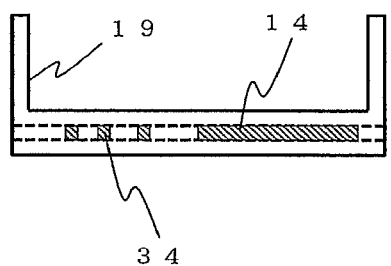
FIG. 19 is a sectional view for illustrating the liquid refrigerant flow path in the power conversion apparatus of the cooling system according to the fifth embodiment of the present invention.

With reference to FIG. 18 and FIG. 19, the degassing flow path 34 is formed between the first heat-radiating portion 15 and the fourth heat-radiating portion 18. According to such a configuration, when a U-shaped flow path is formed from the inlet 8 into which the liquid refrigerant flows to the outlet 9 from which the liquid refrigerant flows, air accumulation is liable to be generated in the vicinity of the inlet 8 in the fourth heat-radiating portion 18. However, the air accumulation can be discharged through the degassing flow path 34.

REFERENCE SIGNS LIST

1 power conversion apparatus, 2 motor, 3 radiator, 4 pump, 5 liquid refrigerant pipe, 6 cooling system, 7 upper lid, 8 inlet, 9 outlet, 10 first component group, 11 second component group, 12 third component group, 13 fourth component group, 14 liquid refrigerant flow path, 15 first heat-radiating portion, 16 second heat-radiating portion, 17 third heat-radiating portion, 18 fourth heat-radiating portion, 19 placement plate, 20 bottom plate, 21 first region, 22 second region, 23 third region, 24 fourth region, 25 terminal block, 26 screw, 27 bus bar, 28 boss, 29 fourth heat-radiating fin, 30 fourth heat-radiating fin, 31 fourth heat-radiating fin, 32 boss, 33 boss, 34 degassing flow path, 35 heat-generating element, 36 heat-radiating fin, 37 cooling water flow at flow inlet portion, 38 cooling water flow in heat-radiating fin portion, 39 cooler housing, 40 first region, 41 second region

The invention claimed is:

1. A cooling system, comprising:
a placement plate on which a plurality of components are disposed, and
a liquid refrigerant flow path, which is formed on an opposite side of the placement plate with respect to the plurality of components, and is configured to allow a liquid refrigerant for cooling the plurality of components to flow therethrough,
wherein the liquid refrigerant flow path includes:
a liquid refrigerant inlet portion, which is disposed in a perpendicular direction with respect to the liquid refrigerant flow path, and is configured to allow the liquid refrigerant to flow into the liquid refrigerant flow path,
a liquid refrigerant outlet portion, which is disposed in the perpendicular direction with respect to the liquid refrigerant flow path, and is configured to allow the liquid refrigerant to flow out from the liquid refrigerant flow path,
a first region, in which a plurality of fins are disposed, and in which the liquid refrigerant flows from the liquid refrigerant inlet portion to the liquid refrigerant outlet portion in a shortest distance, the first region including a linear path starting from the liquid refrigerant inlet portion and extending to the liquid refrigerant outlet portion, and
a second region, in which another plurality of fins are disposed, and which is different from the first region,
wherein a fin-mounting volume ratio of the another plurality of fins in the second region is larger than a fin-mounting volume ratio of the plurality of fins in the first region, and
wherein a region in a vicinity of the liquid refrigerant inlet portion in the first region has a smaller fin-mounting volume ratio than a region in a vicinity of the liquid refrigerant outlet portion in the first region.

2. The cooling system according to claim 1, further comprising:
another second region,
wherein the first region is between said second region and said another second region.

3. The cooling system according to claim 2, wherein:
the first region and the second region have substantially a same length.

4. The cooling system according to claim 1, wherein:
the liquid refrigerant exits the liquid refrigerant inlet portion in the perpendicular direction in order to enter the first region, and the liquid refrigerant exits the liquid refrigerant inlet portion in a direction different from the perpendicular direction, in order to enter the second region.

5. The cooling system according to claim 4, wherein:
each of the plurality of fins is a pin fin and each of the another plurality of fins is a pin fin; and
a number of the pin fins in the second region is larger than a number of the pin fins in the first region.

6. A cooling system, comprising:
a placement plate on which a plurality of components are disposed, and
a liquid refrigerant flow path, which is formed on an opposite side of the placement plate with respect to the plurality of components, and is configured to allow a liquid refrigerant for cooling the plurality of components to flow therethrough,
wherein the liquid refrigerant flow path includes:
a liquid refrigerant inlet portion, which is disposed in a perpendicular direction with respect to the liquid refrigerant flow path, and is configured to allow the liquid refrigerant to flow into the liquid refrigerant flow path,
a liquid refrigerant outlet portion, which is disposed in the perpendicular direction with respect to the liquid refrigerant flow path, and is configured to allow the liquid refrigerant to flow out from the liquid refrigerant flow path,
a first region, in which a plurality of fins are disposed, and in which the liquid refrigerant flows from the liquid refrigerant inlet portion to the liquid refrigerant outlet portion in a shortest distance, the first region including a linear path starting from the liquid refrigerant inlet portion and extending to the liquid refrigerant outlet portion, and
a second region, in which another plurality of fins are disposed, and which is different from the first region,
wherein a fin-mounting volume ratio of the plurality of fins in the first region is different from a fin-mounting volume ratio of the another plurality of fins in the second region,
wherein a region in a vicinity of the liquid refrigerant inlet portion in the first region has a smaller fin-mounting volume ratio than a region in a vicinity of the liquid refrigerant outlet portion in the first region, and
wherein the first region and the second region have substantially a same length.

7. A cooling system, comprising:
a placement plate on which a plurality of components are disposed, and
a liquid refrigerant flow path, which is formed on an opposite side of the placement plate with respect to the plurality of components, and is configured to allow a liquid refrigerant for cooling the plurality of components to flow therethrough, wherein the liquid refrigerant flow path includes:

a liquid refrigerant inlet portion, which is disposed in a perpendicular direction with respect to the liquid refrigerant flow path, and is configured to allow the liquid refrigerant to flow into the liquid refrigerant flow path, a liquid refrigerant outlet portion, which is disposed in the perpendicular direction with respect to the liquid refrigerant flow path, and is configured to allow the liquid refrigerant to flow out from the liquid refrigerant flow path, a first region, in which a plurality of fins are disposed, and in which the liquid refrigerant flows from the liquid refrigerant inlet portion to the liquid refrigerant outlet portion in a shortest distance, and a second region, in which another plurality of fins are disposed, and which is different from the first region, wherein a fin-mounting volume ratio of the plurality of fins in the first region is different from a fin-mounting volume ratio of the another plurality of fins in the second region, wherein a region in a vicinity of the liquid refrigerant inlet portion in the first region has a smaller fin-mounting volume ratio than a region in a vicinity of the liquid refrigerant outlet portion in the first region, and wherein the liquid refrigerant exits the liquid refrigerant inlet portion in the perpendicular direction in order to enter the first region, and the liquid refrigerant exits the liquid refrigerant inlet portion in a direction different from the perpendicular direction, in order to enter the second region.

8. The cooling system according to claim 7, wherein:

the first region includes a linear path starting from the inlet portion and extending to the outlet portion.

* * * * *